United States Patent
Gealy et al.

(10) Patent No.: US 7,271,053 B2
(45) Date of Patent: Sep. 18, 2007

(54) METHODS OF FORMING CAPACITORS AND ELECTRONIC DEVICES

(75) Inventors: F. Daniel Gealy, Kuna, ID (US); Garo J. Derderian, Boise, ID (US); Chris M. Carlson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 11/050,088

(22) Filed: Feb. 3, 2005

(65) Prior Publication Data

US 2005/0145918 A1 Jul. 7, 2005

Related U.S. Application Data

(63) Continuation of application No. 10/449,039, filed on May 30, 2003, now Pat. No. 6,936,513.

(51) Int. Cl.
*H01L 21/8242* (2006.01)

(52) U.S. Cl. ........................ 438/239; 438/250; 438/393
(58) Field of Classification Search ................ 438/239, 438/243, 250, 253, 386, 393; 257/298, 301, 257/306, 312
See application file for complete search history.

(56) References Cited

U.S. PATENT DOCUMENTS

| | | | |
|---|---|---|---|
| 6,790,677 B2 | 9/2004 | Yamawaki | 438/3 |
| 2001/0050391 A1* | 12/2001 | Matsuno et al. | 257/306 |
| 2004/0014316 A1* | 1/2004 | Nakamura | 438/686 |
| 2004/0161532 A1 | 8/2004 | Kloster et al. | 427/240 |
| 2004/0182313 A1* | 9/2004 | Yamawaki | 118/712 |

* cited by examiner

*Primary Examiner*—Dung A. Le
(74) *Attorney, Agent, or Firm*—Wells St. John P.S.

(57) ABSTRACT

A method of forming a capacitor includes forming a first conductive capacitor electrode layer over a substrate. The first electrode layer has an outer surface comprising a noble metal in at least one of elemental and alloy forms. A gaseous mixture comprising a metallorganic deposition precursor and an organic solvent is fed to the outer surface under conditions effective to deposit a capacitor dielectric layer onto the outer surface. A conductive capacitor electrode layer is formed over the capacitor dielectric layer. A method of forming an electronic device includes forming a conductive layer over a substrate. The conductive layer has an outer surface comprising a noble metal in at least one of elemental and alloy forms. A gaseous mixture comprising a metallorganic deposition precursor and an organic solvent is fed to the outer surface under conditions effective to deposit a dielectric layer onto the outer surface.

61 Claims, 4 Drawing Sheets

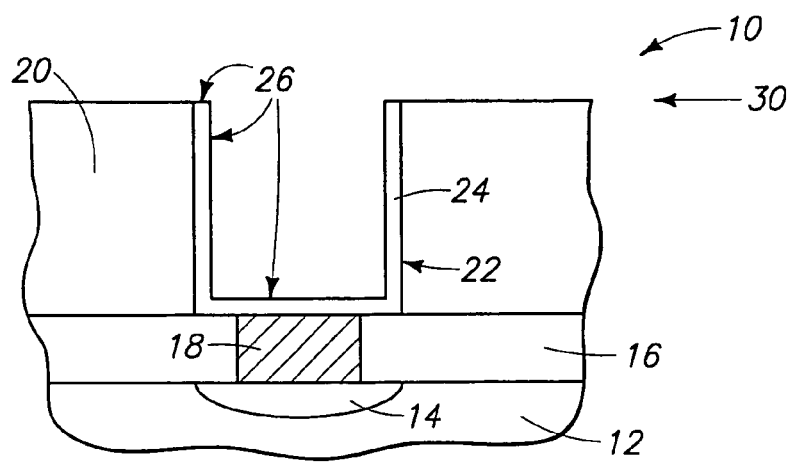
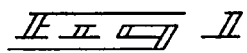
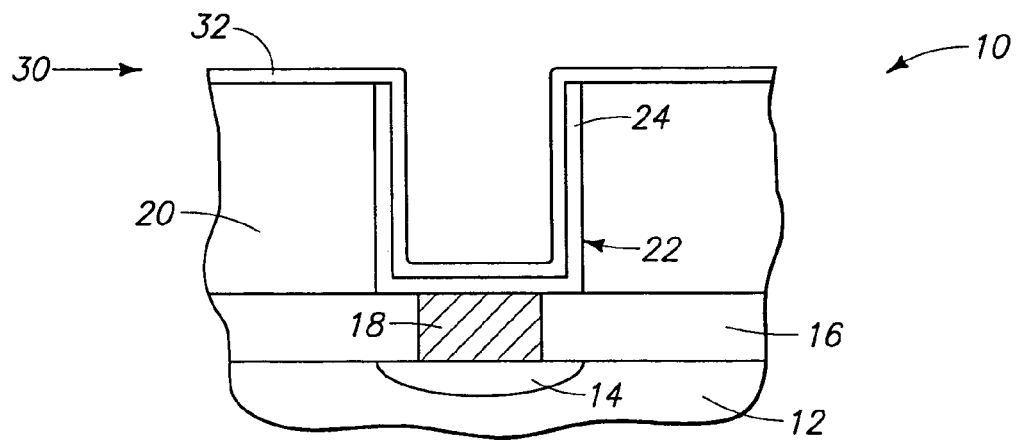
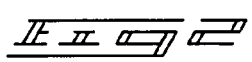
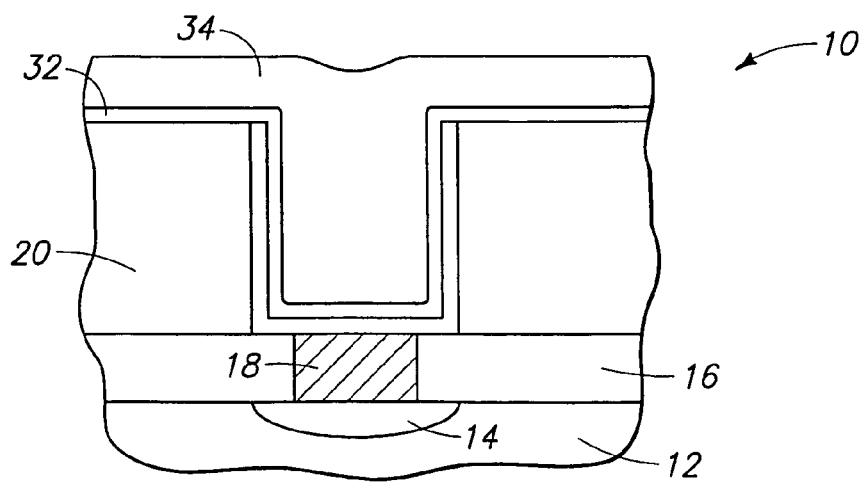
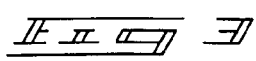

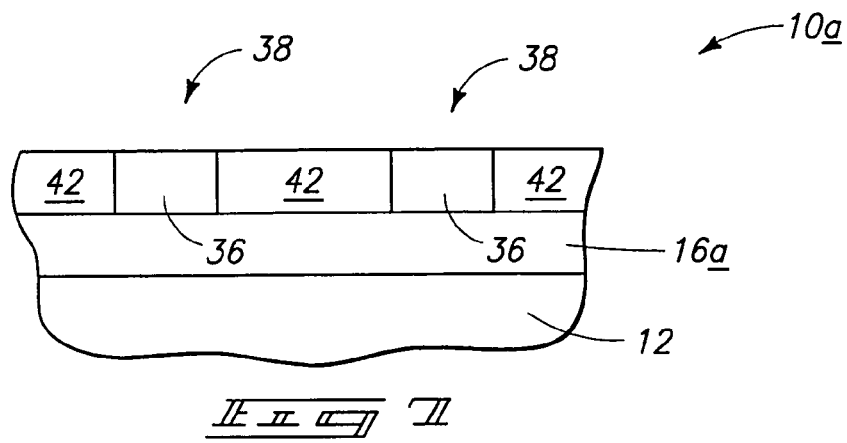
_FIG. 7_
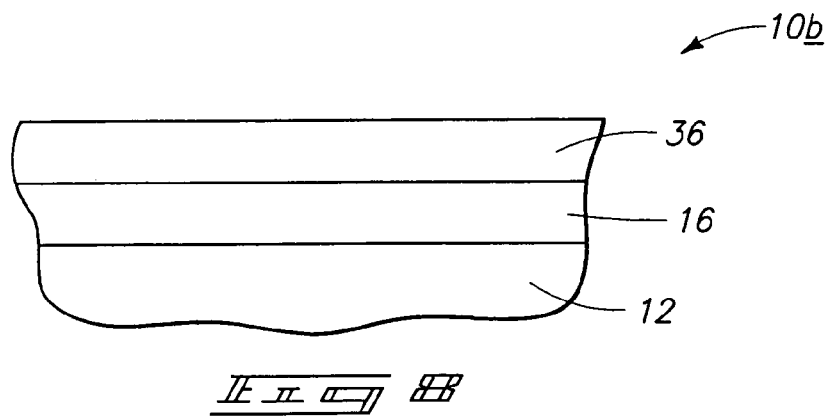
_FIG. 8_
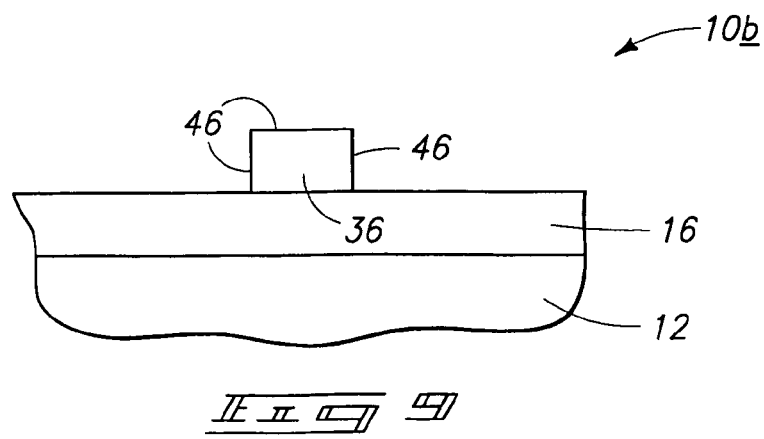
_FIG. 9_

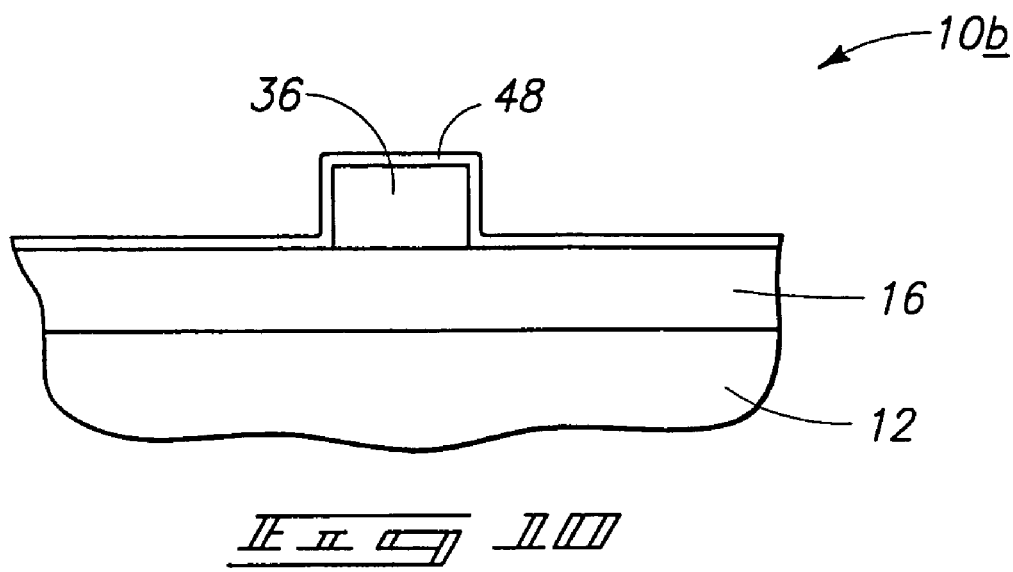
F I G. 10
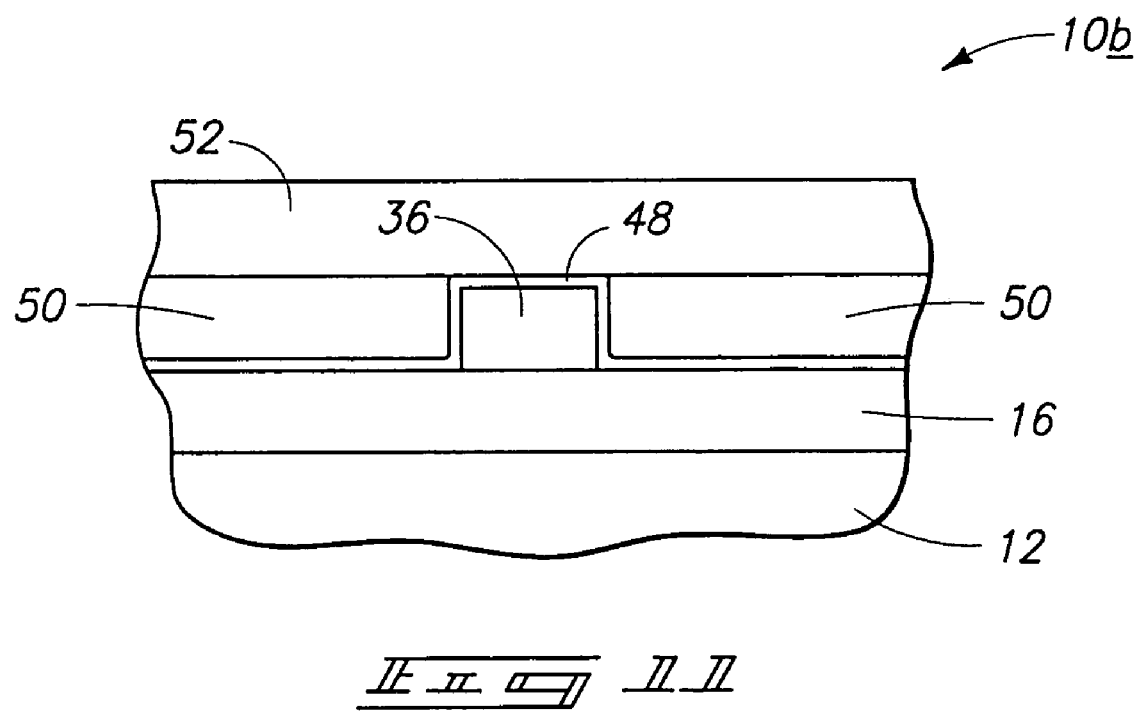
F I G. 11

METHODS OF FORMING CAPACITORS AND ELECTRONIC DEVICES

RELATED PATENT DATA

This patent resulted from a continuation application of U.S. patent application Ser. No. 10/449,039, now U.S. Pat. No. 6,936,513, filed May 30, 2003, entitled "Methods of Forming Capacitors and Electronic Devices", naming F. Daniel Gealy, Garo J. Derderian, and Chris M. Carlson as inventors, the disclosure of which is incorporated by reference.

TECHNICAL FIELD

The invention is related to methods of forming capacitors and other electronic devices.

BACKGROUND OF THE INVENTION

A continuing goal in integrated circuitry fabrication is to form the circuitry components to be smaller and denser over a given area of a semiconductor substrate. One common electronic circuit device is a capacitor, which has a capacitor dielectric region received between a pair of conductive electrodes. In such devices, there is a continuing challenge to maintain sufficiently high storage capacitance despite decreasing area in the denser circuits. Additionally, there is a continuing goal to further decrease horizontal area occupied by the capacitor. One manner of increasing capacitance is through cell structure techniques, for example forming trench or stacked capacitors.

Highly integrated memory devices, for example 256 Mbit DRAMs and beyond, are expected to require a very thin dielectric film for cylindrically stacked, trenched or other capacitor structures. To meet this requirement, the capacitor dielectric film thickness will be below 2.5 nanometer of $SiO_2$ equivalent thickness. Accordingly, materials other than $SiO_2$ having higher dielectric constants are expected to be used. $Si_3N_4$ is one such material which has been used either alone or in combination with silicon dioxide as a capacitor dielectric region. Insulating inorganic metal oxide materials, for example $Al_2O_3$, $Ta_2O_5$ and barium strontium titanate, have even higher dielectric constants and low leakage currents which make them attractive as capacitor dielectric materials for high density DRAMs, non-volatile memories and other integrated circuitry.

In many such applications, it would be highly desirable to utilize metal for the capacitor electrodes, thus forming a metal-insulator-metal (MIM) capacitor. Exemplary proposed metals include platinum, rhodium, ruthenium, palladium and iridium. Such might be utilized in elemental and/or alloy form in many instances.

The ever increasing density in the fabrication of integrated circuitry is resulting in individual devices occupying less horizontal area at the expense of an increase in the vertical, or orthogonal, dimension of the individual devices. One common and typical capacitor construction includes a container-shaped capacitor where at least one of the capacitor electrodes has a container or cup-like shape. An example manner of forming such containers is to initially form a capacitor opening within an insulative layer. One or more conductive capacitor electrode layers are then deposited to less than fill and to line the opening. The conductive layer or layers are typically then planarized back relative to the insulative layer(s), thus forming a container-shaped capacitor electrode.

One or more capacitor dielectric layers are then conformally deposited over the container-shaped electrode. One manner of doing so includes chemical vapor deposition using a metallorganic deposition precursor. In the context of this document, a "metallorganic" is any organic molecule having a metal constituting a part thereof. Unfortunately, platinum, rhodium, iridium, ruthenium and palladium can have a catalytic effect on the decomposition of certain metallorganic precursors. In many applications, it has been found that a capacitor dielectric layer formed by chemical vapor deposition utilizing a metallorganic precursor over an outer capacitor surface having at least one of these metals in elemental and/or alloy form has a tendency to deposit considerably thicker at the upper portions of the container. This can result in a bread-loafing effect, and in some instances to an extreme of depositing essentially none of the capacitor dielectric material towards the bottom half of the container. It is theorized that, perhaps, these metals are catalyzing decomposition of the metallorganic precursor restricting or precluding their deposit of a desired capacitor dielectric layer at the bottom portions of the containers.

While the invention was motivated in addressing the above-described issues, it is in no way so limited. The invention is only limited by the accompanying claims as literally worded, without interpretative or other limiting reference to the specification, and in accordance with the doctrine of equivalents.

SUMMARY OF THE INVENTION

The invention includes methods of forming capacitors and electronic devices. In one implementation, a method of forming a capacitor includes forming a first conductive capacitor electrode layer over a substrate. The first electrode layer has an outer surface comprising a noble metal in at least one of elemental and alloy forms. A gaseous mixture comprising a metallorganic deposition precursor and an organic solvent is fed to the outer surface under conditions effective to deposit a capacitor dielectric layer onto the outer surface. A conductive capacitor electrode layer is formed over the capacitor dielectric layer.

In one implementation, a method of forming an electronic device includes forming a conductive layer over a substrate. The conductive layer has an outer surface comprising a noble metal in at least one of elemental and alloy forms. A gaseous mixture comprising a metallorganic deposition precursor and an organic solvent is fed to the outer surface under conditions effective to deposit a dielectric layer onto the outer surface.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

FIG. 7 is a view of the FIG. 6 wafer fragment at a processing step subsequent to that shown by FIG. 6.

FIG. 8 is a diagrammatic sectional view of a semiconductor wafer fragment in process in accordance with an aspect of the invention.

FIG. 9 is a view of the FIG. 8 wafer fragment at a processing step subsequent to that shown by FIG. 8.

FIG. 10 is a view of the FIG. 9 wafer fragment at a processing step subsequent to that shown by FIG. 9.

FIG. 11 is a view of the FIG. 10 wafer fragment at a processing step subsequent to that shown by FIG. 10.

DETAILED DESCRIPTION OF THE PREFERRED EMBODIMENTS

Figure 4:
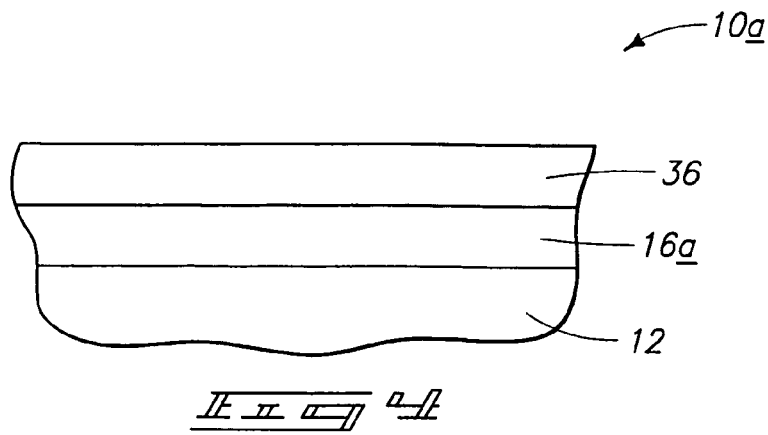
FIG. 4 is a diagrammatic sectional view of a semiconductor wafer fragment in process in accordance with an aspect of the invention.

This disclosure of the invention is submitted in furtherance of the constitutional purposes of the U.S. Patent Laws "to promote the progress of science and useful arts" (Article 1, Section 8).

One preferred embodiment method of forming a capacitor, in accordance with some aspects of the invention, is described with reference to FIGS. 1-3. Referring initially to FIG. 1, a wafer fragment 10 includes a bulk substrate 12, for example a semiconductor substrate such as bulk monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated. A conductive diffusion region 14 has been formed within substrate material 12.

An insulative layer 16 is formed over substrate 12. Any dielectric material, whether existing or yet-to-be developed, could be utilized for layer 16. By way of example only, examples include doped or undoped silicon dioxide, for example borophosphosilicate glass, phosphosilicate glass, borosilicate glass, etc. A conductive contact 18 is formed through layer 16 to be in electrical connection with diffusion region 14. Material 18 might comprise more than one conductive material, and could be for example conductively doped semiconductive materials, elemental metals, metal alloys, metal compounds, etc.

An insulative layer 20 has been formed over layer 16. Such might be the same as or different in composition from material 16. A capacitor opening 22 has been formed within layer 20 over conductive contact 18. A container-shaped conductive capacitor electrode 24 is formed over substrate 20/16/12 within opening 22. Container-shaped electrode 24 has an outer surface 26 which comprises a noble metal in at least one of elemental and alloy forms. In the context of this document, "noble metal" is defined more narrowly than is typical, and herein meaning any one or combination of platinum, rhodium, iridium, ruthenium and palladium. However and of course, outer surface 26 and/or internal portions of capacitor electrode 24 might include other metals as long as at least some noble metal, as just defined, is included as some part of outer surface 26. Container-shaped electrode 24 might be formed by any existing or yet-to-be developed methods. Examples include physical vapor deposition, chemical vapor deposition and atomic layer deposition. For example, one or more conductive electrode layers could be deposited over dielectric layer 20 to the illustrated thickness of capacitor electrode 24. Such layer could then be planarized back relative to the outer surface of layer 20, thereby defining the illustrated capacitor electrode 24.

The illustrated and preferred embodiment of FIGS. 1-3 is described in the context of formation of a capacitor comprising a container-shaped conductive capacitor electrode. However, certain aspects of the invention are in no way so limited. Fabrication of any shape first capacitor electrode layer (of course including multiple layers) is contemplated, whether existing or yet-to-be developed. Further, the outer surface of the capacitor electrode might comprise, consist essentially of, or consist of one or more of the stated noble metals or any mixture of the stated noble metals. Further in the illustrated exemplary embodiment, substrate 10 can be considered as having some global outer surface 30 extending largely/essentially across an entirety of the substrate. Outer surface 26 of capacitor electrode layer 24 includes a majority portion (i.e., the vertical portion of such surface, as illustrated) which is substantially normal to substrate global outer surface 30. In the context of this document, "substantially normal" means within 10° up to and including exactly normal to the stated global/mean substrate surface.

Referring to FIG. 2, a gaseous mixture comprising a metallorganic deposition precursor and an organic solvent are fed to outer surface 26 under conditions effective to deposit a capacitor dielectric layer 32 onto outer surface 26. In the context of this document, an "organic solvent" is any carbon containing compound or compounds having a boiling point of less than 100° C. at one atmosphere. By way of example only, exemplary materials include at least one of an alcohol, a ketone, an aldehyde, an alkyl, an alkene, an ether, an amine, and an amide. Specific examples include one or more of methanol, ethanol, acetone, methyl ethyl ketone, formaldehyde, acetaldehyde, methane, ethane, propane, butane, pentane, ethane, propene, dimethyl ether, diethyl ether, methyl ethyl ether, dimethyl amine, and methyl ethyl amine. Further by way of example only, the conditions might comprise chemical vapor deposition, atomic layer deposition, and/or any yet-to-be developed technique (or some combination thereof) using a vapor deposition precursor and an organic solvent. An exemplary preferred temperature range is from 250° C. to 500° C., and more preferably from 400° C. to 500° C. An exemplary preferred pressure is subatmospheric, for example being from 0.5 Torr to 5 Torr. The conditions are typically and preferably void of plasma, although plasma conditions might also be utilized. One preferred capacitor dielectric layer material comprises an oxide having a dielectric constant k greater than 5.0. An exemplary thickness of the deposited layer 32 is from 20 Angstroms to 200 Angstroms.

The organic solvent and metallorganic deposition precursor might be combined prior to entering the reactor chamber, and fed (for example) through a showerhead. Alternately, separate gas feeds for the metallorganic precursor and the organic solvent might be provided to the chamber as a manner of providing a mixture of such materials to the outer surface of the capacitor electrode layer. In one preferred embodiment, the organic solvent is present in the gaseous mixture at less than 50% by weight of a sum of the organic solvent and metallorganic precursor, more preferably present in the gaseous mixture at from 1% to 10% by weight, and in one example present in the gaseous mixture at from 3% to 5% by weight. However, solvent concentration in the gaseous mixture alternately might be 50% or greater by weight of a sum of the organic solvent and metallorganic precursor.

The invention was reduced-to-practice under chemical vapor deposition conditions where the metallorganic precursor was pentathoxy tantalum, the gaseous mixture comprised oxygen, the capacitor dielectric layer comprised tantalum pentoxide, and the organic solvent comprised an alcohol. The outer electrode layer surface consisted essentially of elemental platinum. More specifically, the conditions included a deposition temperature of 430° C., a pressure of 4 Torr, a pentathoxy tantalum flow of 33.25 mg/min, an ethanol flow of 1.75 mg/min, 1.5 liters/minute of $O_2$ and an inert gas flow of $N_2$ at 1 liter per minute to an Applied Materials Centura reactor having an internal volume of six liters.

By way of example only, exemplary capacitor dielectric layers include any one or combination of $HfO_2$, $Ta_2O_5$, $Y_2O_3$, $ZrO_2$, $HfSiO_4$, $ZrSiO_4$, $YSiO_4$, $Al_2O_3$, AlN, and HfN. Exemplary metallorganic precursors include tertbutylaluminum alkoxide, triethylaluminum, trimethylaluminum, tetrakisdimethylamido hafnium, pentathoxy tantalum, n-butyl cyclopentadienyl yttrium, and other metal alkyls or metal alkoxides.

Where an oxide is to be formed, exemplary preferred oxidizers include $O_2$, $O_3$, $H_2O$, $NO_2$ and NO. Where the capacitor dielectric layer being formed comprises nitrogen, exemplary nitrogen containing precursors include $NH_3$ and $N_2$ where preclusion of formation of an oxide is desired.

In one exemplary preferred implementation, as might be directed to overcoming the prior art problem identified above, the capacitor dielectric layer is preferably deposited to a substantially constant thickness, meaning to be within 20% of the thickest portion of the capacitor dielectric layer as deposited over the outer surface. In the prior art problem identified above, a lack of constant thickness deposition was observed to the point of essentially no deposition at lower portions of the container-shaped capacitor electrode.

Referring to FIG. 3, a conductive capacitor electrode layer 34 has been formed over capacitor dielectric layer 32. Layer 34 might constitute the same or different material(s) as compared to the material(s) of capacitor electrode layer 24.

The invention was reduced-to-practice and seemed to perhaps have greatest applicability in the fabrication of capacitors having at least one container shaped electrode, and particularly where some first electrode outer surface includes a majority portion which is substantially normal to the substrate global outer surface, as such surfaces are where the prior art problem identified above was found to particularly manifest. However, the invention is perceived to have applicability in the fabrication of other capacitors and of any electronic device wherein a conductive layer is formed over a substrate, with the conductive layer having an outer surface comprising a noble metal in at least one of elemental and alloy forms. A gaseous mixture comprising a metallorganic deposition precursor and an organic solvent is fed to such outer surface under conditions effective to deposit a dielectric layer onto the surface. Preferred attributes are otherwise as described above in connection with the FIGS. 1-3 embodiment, in connection with a capacitor fabrication.

By way of example only, one exemplary electronic device would be an interconnect line wherein the conductive layer would be formed into some desired interconnect line shape. Further by way of example only, an alternate example would be an electronic device comprising a field effect transistor gate, with the conductive layer comprising conductive material of the field effect transistor gate, and the dielectric layer comprising a gate dielectric of the field effect transistor gate.

For example, FIGS. 4-7 depict an exemplary method of forming an electronic device in the form of multiple interconnect lines. Like numerals from the first described embodiment are utilized where appropriate, with differences being indicated with different numerals or with the suffix "a". FIG. 4 depicts substrate fragment 10*a* having a conductive layer 36 fabricated over an insulative layer 16*a*.

Figure 5:
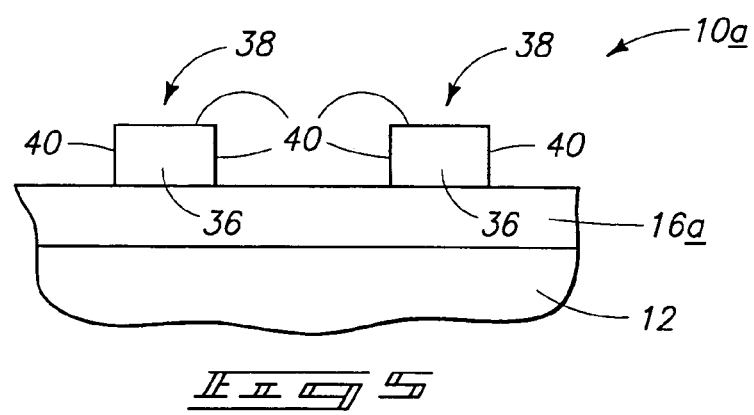
FIG. 5 is a view of the FIG. 4 wafer fragment at a processing step subsequent to that shown by FIG. 4.

Referring to FIG. 5, conductive layer 36 has been appropriately processed, for example by photolithographic patterning and etch, to be formed into interconnect line shapes 38. Such include outer surfaces 40 comprising a noble metal in at least one of elemental and alloy forms.

Figure 6:
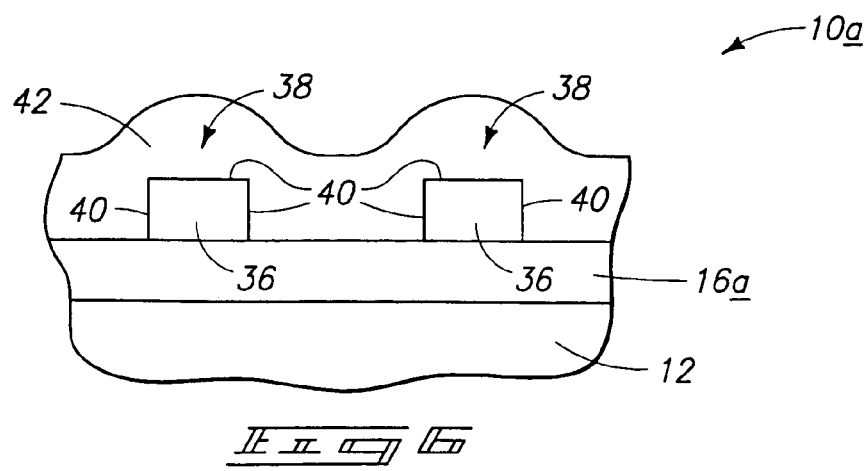
FIG. 6 is a view of the FIG. 5 wafer fragment at a processing step subsequent to that shown by FIG. 5.

Referring to FIG. 6, a gaseous mixture comprising a metallorganic deposition precursor and an organic solvent has been fed to outer surface 40 under conditions effective to deposit a dielectric layer 42 onto such outer surface. In the illustrated exemplary embodiment, FIG. 7 depicts dielectric layer 42 having been planarized back to approximately the upper outermost surface of interconnect lines 38 (i.e., by chemical mechanical polishing). By way of example only, such depicts a method of forming an electronic device in the form of at least one conductive interconnect line, with the dielectric layer formed serving as a protective insulating layer.

FIGS. 8-10 depict, by way of example only, the formation of an electronic device in the form of a field effect transistor. Like numerals from the first described embodiment are utilized where appropriate, with differences being indicated with different numerals or with the suffix "b". FIG. 8 depicts a wafer fragment 10*b* essentially the same as that depicted by FIG. 4.

Referring to FIG. 9, conductive layer 36 has been patterned into an exemplary conductive gate shape having outer surfaces 46 comprising a noble metal in at least one of elemental and alloy forms.

Referring to FIG. 10, a gaseous mixture comprising a metallorganic deposition precursor and an organic solvent has been fed to outer surface 46 under conditions effective to deposit a dielectric layer 48 onto outer surface 46. Such dielectric layer will, at least in part, form part of a gate dielectric of the field effect transistor being formed.

Referring to FIG. 11, an interlevel insulating dielectric layer 50 has been formed over the substrate and planarized back relative to the outermost surface of gate dielectric layer 48. A semiconductor layer 52 has been deposited thereover. An exemplary material is crystalline silicon, which can be appropriately doped in different regions to form a pair of source/drain regions and a channel region therebetween over the illustrated transistor gate.

In compliance with the statute, the invention has been described in language more or less specific as to structural and methodical features. It is to be understood, however, that the invention is not limited to the specific features shown and described, since the means wherein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor, comprising:
   forming a first conductive capacitor electrode layer over a substrate, the first electrode layer having an outer surface comprising a noble metal in at least one of elemental and alloy forms;
   feeding a gaseous mixture comprising a metallorganic deposition precursor and an organic solvent to the outer surface under conditions effective to deposit a capacitor dielectric layer onto the outer surface; and
   forming a second conductive capacitor electrode layer over the capacitor dielectric layer.

2. The method of claim 1 wherein the noble metal is in elemental form.

3. The method of claim 1 wherein the noble metal is in alloy form.

4. The method of claim 1 wherein the noble metal comprises Pt.

5. The method of claim 1 wherein the noble metal comprises Rh.

6. The method of claim 1 wherein the noble metal comprises Ir.

7. The method of claim 1 wherein the noble metal comprises Ru.

8. The method of claim 1 wherein the noble metal comprises Pd.

9. The method of claim 1 wherein the outer surface comprises a mixture of noble metals.

10. The method of claim 1 wherein the organic solvent is present in the gaseous mixture at less than or equal to 50% by weight of a sum of the organic solvent and metallorganic precursor.

11. The method of claim 1 wherein the organic solvent is present in the gaseous mixture at less than or equal to 25% by weight of a sum of the organic solvent and metallorganic precursor.

12. The method of claim 1 wherein the organic solvent is present in the gaseous mixture at from 1% to 10% by weight of a sum of the organic solvent and metallorganic precursor.

13. The method of claim 1 wherein the organic solvent is present in the gaseous mixture at from 3% to 5% by weight of a sum of the organic solvent and metallorganic precursor.

14. The method of claim 1 wherein the organic solvent is present in the gaseous mixture at 50% or greater by weight of a sum of the organic solvent and metallorganic precursor.

15. The method of claim 1 wherein the organic solvent comprises at least one of an alcohol, a ketone, an aldehyde, an alkyl, an alkene, an ether, an amine, and an amide.

16. The method of claim 1 wherein the conditions comprise chemical vapor deposition.

17. The method of claim 1 wherein the conditions comprise atomic layer deposition.

18. The method of claim 1 wherein the conditions are void of plasma.

19. The method of claim 1 wherein the capacitor dielectric layer is deposited to a substantially constant thickness within 20% of its thickest portion over the outer surface.

20. The method of claim 1 wherein the substrate has a global outer surface, the first electrode outer surface including a majority portion which is substantially normal to the substrate global outer surface.

21. The method of claim 1 wherein the first conductive capacitor electrode layer has a container shape.

22. The method of claim 1 wherein the organic solvent comprises an alcohol.

23. The method of claim 1 wherein organic solvent comprises a ketone.

24. The method of claim 1 wherein organic solvent comprises an aldehyde.

25. The method of claim 1 wherein organic solvent comprises an alkyl.

26. The method of claim 1 wherein organic solvent comprises an alkene.

27. The method of claim 1 wherein organic solvent comprises an ether.

28. The method of claim 1 wherein organic solvent comprises an amine.

29. The method of claim 1 wherein organic solvent comprises an amide.

30. A method of forming an electronic device, comprising:
    forming a conductive layer over a substrate, the conductive layer having an outer surface comprising a noble metal in at least one of elemental and alloy forms; and
    feeding a gaseous mixture comprising a metallorganic deposition precursor and an organic solvent to the outer surface under conditions effective to deposit a dielectric layer onto the outer surface.

31. The method of claim 30 wherein,
    the conditions comprise chemical vapor deposition;
    the dielectric layer comprises an oxide having a dielectric constant k greater than 5.0;
    the organic solvent is present in the gaseous mixture at from 1% to 10% by weight of a sum of the organic solvent and metallorganic precursor; and
    the organic solvent comprises at least one of an alcohol, a ketone, an aldehyde, an alkyl, an alkene, an ether, an amine, and an amide.

32. The method of claim 30 wherein the conditions comprise chemical vapor deposition, the metallorganic precursor comprises pentathoxy tantalum, the gaseous mixture comprises oxygen, the capacitor dielectric layer comprises tantalum pentoxide, and the organic solvent comprises an alcohol.

33. The method of claim 30 wherein the conductive layer is formed into an interconnect line, and the electronic device comprises an interconnect line.

34. The method of claim 30 wherein the electronic device comprises a field effect transistor gate, the conductive layer comprising conductive material of the field effect transistor gate, the dielectric layer comprising a gate dielectric of the field effect transistor gate.

35. The method of claim 30 wherein the noble metal is in elemental form.

36. The method of claim 30 wherein the noble metal is in alloy form.

37. The method of claim 30 wherein the noble metal comprises Pt.

38. The method of claim 30 wherein the noble metal comprises Rh.

39. The method of claim 30 wherein the noble metal comprises Ir.

40. The method of claim 30 wherein the noble metal comprises Ru.

41. The method of claim 30 wherein the noble metal comprises Pd.

42. The method of claim 30 wherein the outer surface comprises a mixture of noble metals.

43. The method of claim 30 wherein the organic solvent is present in the gaseous mixture at less than or equal to 50% by weight of a sum of the organic solvent and metallorganic precursor.

44. The method of claim 30 wherein the organic solvent is present in the gaseous mixture at less than or equal to 25% by weight of a sum of the organic solvent and metallorganic precursor.

45. The method of claim 30 wherein the organic solvent is present in the gaseous mixture at from 1% to 10% by weight of a sum of the organic solvent and metallorganic precursor.

46. The method of claim 30 wherein the organic solvent is present in the gaseous mixture at from 3% to 5% by weight of a sum of the organic solvent and metallorganic precursor.

47. The method of claim 30 wherein the organic solvent is present in the gaseous mixture at 50% or greater by weight of a sum of the organic solvent and metallorganic precursor.

48. The method of claim 30 wherein the organic solvent comprises at least one of an alcohol, a ketone, an aldehyde, an alkyl, an alkene, an ether, an amine, and an amide.

49. The method of claim 30 wherein the conditions comprise chemical vapor deposition.

50. The method of claim 30 wherein the conditions comprise atomic layer deposition.

51. The method of claim 30 wherein the conditions are void of plasma.

52. The method of claim 30 wherein the dielectric layer is deposited to a substantially constant thickness within 20% of its thickest portion over the outer surface.

53. The method of claim 30 wherein the substrate has a global outer surface, the first electrode outer surface including a majority portion which is substantially normal to the substrate global outer surface.

54. The method of claim 30 wherein the organic solvent comprises an alcohol.

55. The method of claim 30 wherein organic solvent comprises a ketone.

56. The method of claim 30 wherein organic solvent comprises an aldehyde.

57. The method of claim 30 wherein organic solvent comprises an alkyl.

58. The method of claim 30 wherein organic solvent comprises an alkene.

59. The method of claim 30 wherein organic solvent comprises an ether.

60. The method of claim 30 wherein organic solvent comprises an amine.

61. The method of claim 30 wherein organic solvent comprises an amide.

* * * * *